(12) United States Patent
Koyasu

(10) Patent No.: US 7,221,224 B2
(45) Date of Patent: May 22, 2007

(54) DIFFERENTIAL AMPLIFIER CIRCUIT

(75) Inventor: Takahisa Koyasu, Chita (JP)

(73) Assignee: Denso Corporation, Kariya (JP)

( * ) Notice: Subject to any disclaimer, the term of this patent is extended or adjusted under 35 U.S.C. 154(b) by 153 days.

(21) Appl. No.: 11/087,709

(22) Filed: Mar. 24, 2005

(65) Prior Publication Data
US 2005/0225389 A1    Oct. 13, 2005

(30) Foreign Application Priority Data
Apr. 8, 2004    (JP)    ............... 2004-113860

(51) Int. Cl.
*H03F 3/45*    (2006.01)
(52) U.S. Cl. ..................... 330/252; 330/257
(58) Field of Classification Search ........ 330/252, 330/257, 261
See application file for complete search history.

(56) References Cited

U.S. PATENT DOCUMENTS 5,289,136 A *  2/1994  DeVeirman et al. ........ 330/252
5,878,082 A     3/1999  Kishigami ............... 375/257
6,433,636 B2    8/2002  Kasuya et al. ............ 330/255
6,483,683 B1   11/2002  Stenström ............... 361/91.1

FOREIGN PATENT DOCUMENTS

JP    A-05-304447    11/1993
JP    A-09-083267     3/1997

OTHER PUBLICATIONS

Notice of Rejection from Japanese Patent Office issued on Aug. 29, 2006 for the corresponding Japanese patent application No. 2004-113860 (a copy and English translation thereof).

* cited by examiner

*Primary Examiner*—Steven J. Mottola
(74) *Attorney, Agent, or Firm*—Posz Law Group, PLC

(57) ABSTRACT

In a comparator, diodes are disposed between differential pair transistors and current mirror pair transistors forming active loads. The diodes may be disposed between the differential pair transistors and the current mirror pair transistors or between the current mirror pair transistors and a ground line. In addition, diodes are disposed between signal input transistors and the ground line and between the differential pair transistors and the signal input transistors, respectively.

5 Claims, 4 Drawing Sheets

DIFFERENTIAL AMPLIFIER CIRCUIT

CROSS REFERENCE TO RELATED APPLICATION

This patent application is based on and incorporates herein by reference Japanese Patent Application No. 2004-113860 filed on Apr. 8, 2004.

FIELD OF THE INVENTION

The present invention relates to a differential amplifier circuit for performing a differential amplification operation on two input signals.

BACKGROUND OF THE INVENTION

Many electronic control Units (ECUs) are mounted in a vehicle and connected to a communication network. The ECUs perform communication with each other to obtain necessary information, and perform control of respective actuators. As the communication between those ECUs, an in-vehicle local area network (LAN) is used. In a portion requiring high speed communication (~1 Mbps) in a control system of a vehicle, a controller area network (CAN) is often used as a communication protocol. In a body system portion not requiring high speed communication, a local interconnect network (LIN) is becoming a standard.

With respect to circuit elements forming the ECU for communication, the following problem arises. In a state where many ECUs are connected to a bus for communication, in one or some of them, there can occur such a failure as ground disconnection. This disconnection is that the connection between a circuit ground and a ground as a potential reference is shut-off. In this case, the circuit ground of the ECU, which is brought into an open state by the GND disconnection, may rise to the same potential as the power source voltage.

When such a state occurs, current may flow in reverse from the circuit ground of the ECU to the bus for communication. In the ECU for communication and in a receiver circuit as a part to receive a signal transmitted through the bus, a comparator is used to compare a voltage level of a received input signal with a reference voltage level to convert it into two values of high and low. The comparator is constructed by using a differential amplifier circuit.

When the "GND disconnection" occurs, the current flows in reverse from the circuit ground side of the comparator to the input terminal side. Thus, it becomes impossible to perform a normal comparison operation, and in the worst case, the communication of the network is likely to be blocked.

SUMMARY OF THE INVENTION

It is therefore an object of the present invention to provide a differential amplifier circuit which can prevent reverse flow of current even in a case where a ground terminal is brought into an open state by a GND disconnection.

According to a differential amplifier circuit of the present invention, rectifiers connected in a forward direction are respectively disposed between a circuit ground and two transistors forming a differential pair. In a case where a circuit ground potential rises as a result that the circuit ground of the differential amplifier circuit is brought into an open state, when an input terminal voltage of the differential amplifier circuit is lowered, it is supposed that current flows in reverse to an input terminal side through the differential pair transistors by a potential difference. Accordingly, when the rectifiers are disposed as stated above, such reverse flow of the current can be prevented.

Preferably, rectifiers connected in the forward direction are disposed between the circuit ground and signal input transistors. In some cases, the signal input transistors are disposed at the input side of the differential amplifier circuit for the purpose of limiting an input current or shifting an input signal. Accordingly, even in the case where the ground potential rises as a result that the circuit ground is brought into the open state, the rectifiers can prevent the current from flowing in reverse to the input side through the signal input transistor.

Preferably, rectifiers connected in the forward direction are disposed between the signal input transistors and the two transistors forming the differential pair. That is, as a result that the rectifiers are added, a level-shift function occurs by forward direction voltages VF of the respective rectifiers. Then, at a ground side output terminal of each of the transistors forming the differential pair, a shift of 2 VF of the sum of a voltage VF occurs by a transistor of a mirror circuit forming a current source at a ground side, and the forward direction voltage VF of the rectifier. At a power source side output terminal of each of the differential pair transistors, a shift of 2 VF of the sum of the forward direction voltage VF of the rectifier and a voltage VF by the input transistor occurs.

As a result, the transistors do not operate unless the input signal level becomes a level exceeding a voltage between output terminals of the differential pair transistors, since the power source side output terminal of the differential pair transistor and the ground side output terminal thereof have substantially the same potential. Then, when the rectifier is disposed at the signal input circuit, the input signal is level-shifted by the forward direction voltage VF, and the potential of the power source side output terminal of the differential pair transistor can be raised by VF. Accordingly, similarly to the conventional differential amplifier circuit, also with respect to an input signal close to the ground level, it becomes possible to cause a differential amplification operation to be performed.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

First Embodiment

Figure 1:
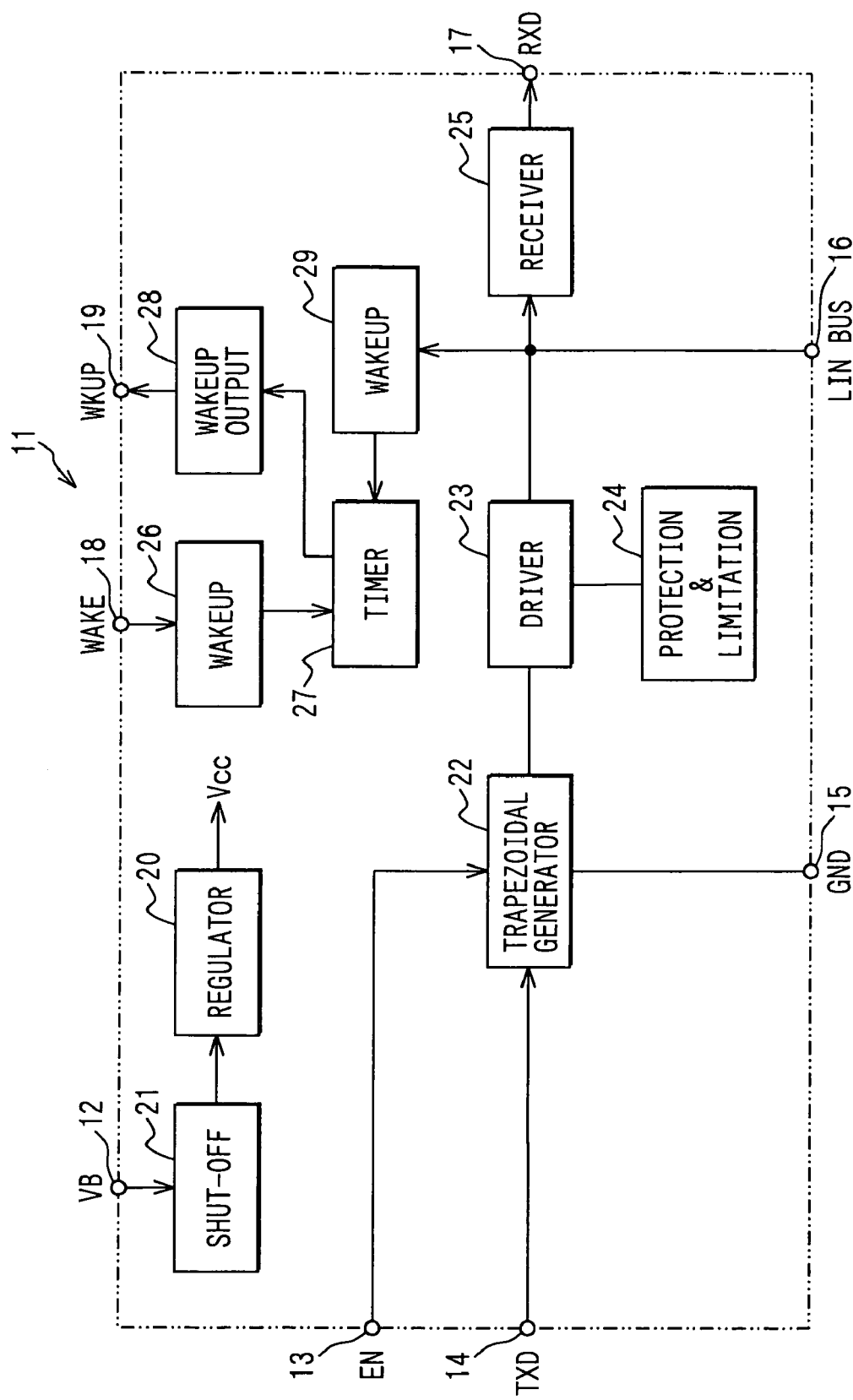
FIG. 1 is a block diagram showing a transceiver IC using a differential amplifier circuit according to a first embodiment of the present invention.
Figure 2:
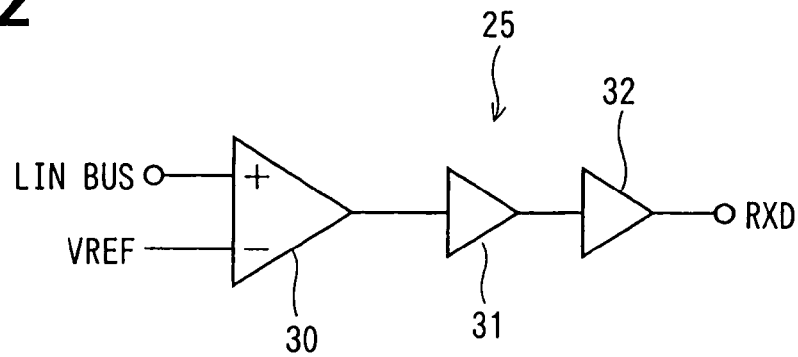
FIG. 2 is a circuit diagram schematically showing a receiver circuit used in the transceiver IC shown in FIG. 1.

A differential amplifier circuit according to the first embodiment of the present invention is applied to a transceiver integrated circuit (IC) used for communication of an in-vehicle LAN shown in FIG. 1. A transceiver IC 11 is mounted on a board provided in the inside of an electronic control unit (ECU) for controlling a body system of a vehicle (automobile), such as a door, a mirror, a roof, a seat, a wiper, a meter and an air conditioner. Although not shown, a control IC (not shown) having a built-in CPU is mounted on this board.

The transceiver IC 11 mounted in the ECU, together with a transceiver IC mounted in another ECU, and a communication line (LIN bus) provided in the vehicle, form a network for a vehicle. The LIN is based on UART/SCI, and has a merit that a system can be constructed at low cost. It is a single wire system extending ISO9141, has a maximum communication speed of 20 kbps, has a through rate is 1 to 3 V/µs, and is a master-slave system with a single master.

As shown in FIG. 1, the transceiver IC 11 has eight terminals 12 to 19. A power source voltage VB of a battery is inputted from the terminal 12 among them. A power source voltage Vcc is generated in a constant voltage regulator circuit 20. Respective circuit blocks in the transceiver IC 11 except for a trapezoidal signal generator circuit 22 and a driver circuit 23, are supplied with the power source voltage Vcc from the voltage regulator circuit 20. Besides, a low voltage shut-off circuit 21 is provided to shut off the power source when it is detected that the power source voltage VB falls to a predetermined voltage (for example, 6 V) or less.

The trapezoidal signal generator circuit 22 operates under the condition that an enable signal EN is applied to the terminal 13, and generates a trapezoidal signal having the foregoing through rate on the basis of transmission data TXD transmitted from the control IC to the terminal 14. The trapezoidal wave signal is formed for reducing radio noise.

The driver circuit 23 is for outputting the trapezoidal wave signal to a LIN bus connected to the terminal 16, and has sufficient current driving capacity to drive the LIN bus even in a state in which 15 transceivers at the maximum are connected. An overheat protecting and overcurrent limiting circuit 24 is added to this driver circuit 23. On the other hand, the receiver circuit 25 receives asynchronous serial communication data transmitted through the LIN bus, and outputs the received data RXD to the control IC through the terminal 17.

In addition to the above basic function, the transceiver IC 11 can switch between a normal operation mode and a low power consumption operation mode (sleep mode). When a predetermined signal is inputted to the terminal 18 from an external switch or the like in the sleep mode, a wakeup circuit 26 starts a timer circuit 27. When the timer circuit 27 counts a fixed time in the signal input state, the sleep mode transitions to the normal operation mode.

At this time, a wakeup signal output circuit 28 outputs a wakeup signal WKUP to the control IC through the terminal 19. Similarly, a wakeup circuit 29 starts the timer circuit 27 when the level of the LIN bus becomes the L level in the sleep mode, and performs wake-up and the output of the wakeup signal WKUP.

Figure 4:
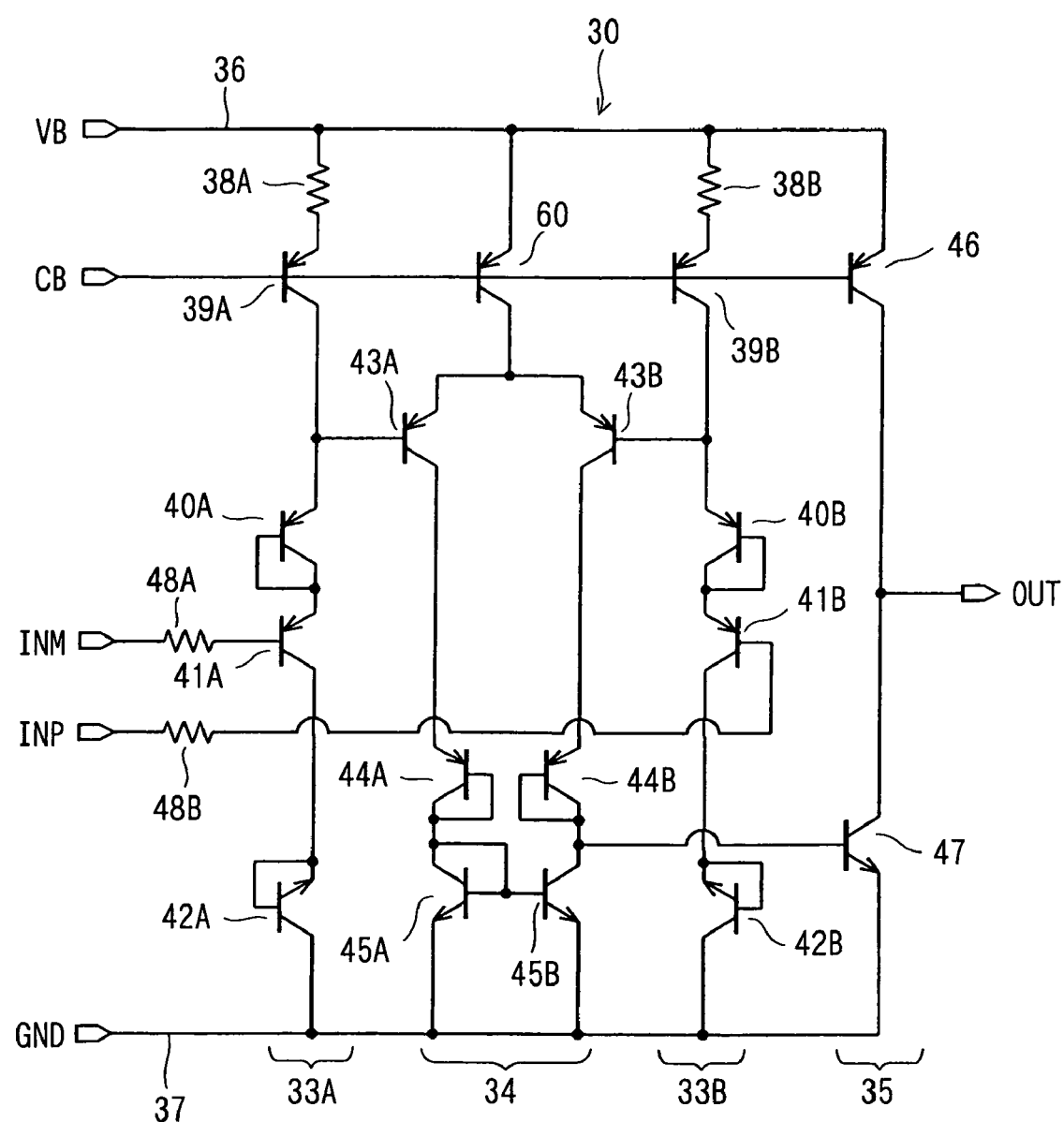
FIG. 4 is a circuit diagram showing a more practical circuit structure of the differential amplifier circuit shown in FIG. 2.

The receiver circuit 25 is schematically shown in FIG. 4. The receiver circuit 25 receives a signal transmitted through the LIN bus 16 by a comparator 30, and compares it with a reference voltage VREF to sharply divide the data level between two values of high and low. The output signal of the comparator 30 is outputted as reception data RXD through a delay (filter) circuit 31 and an output buffer 32.

Figure 3:
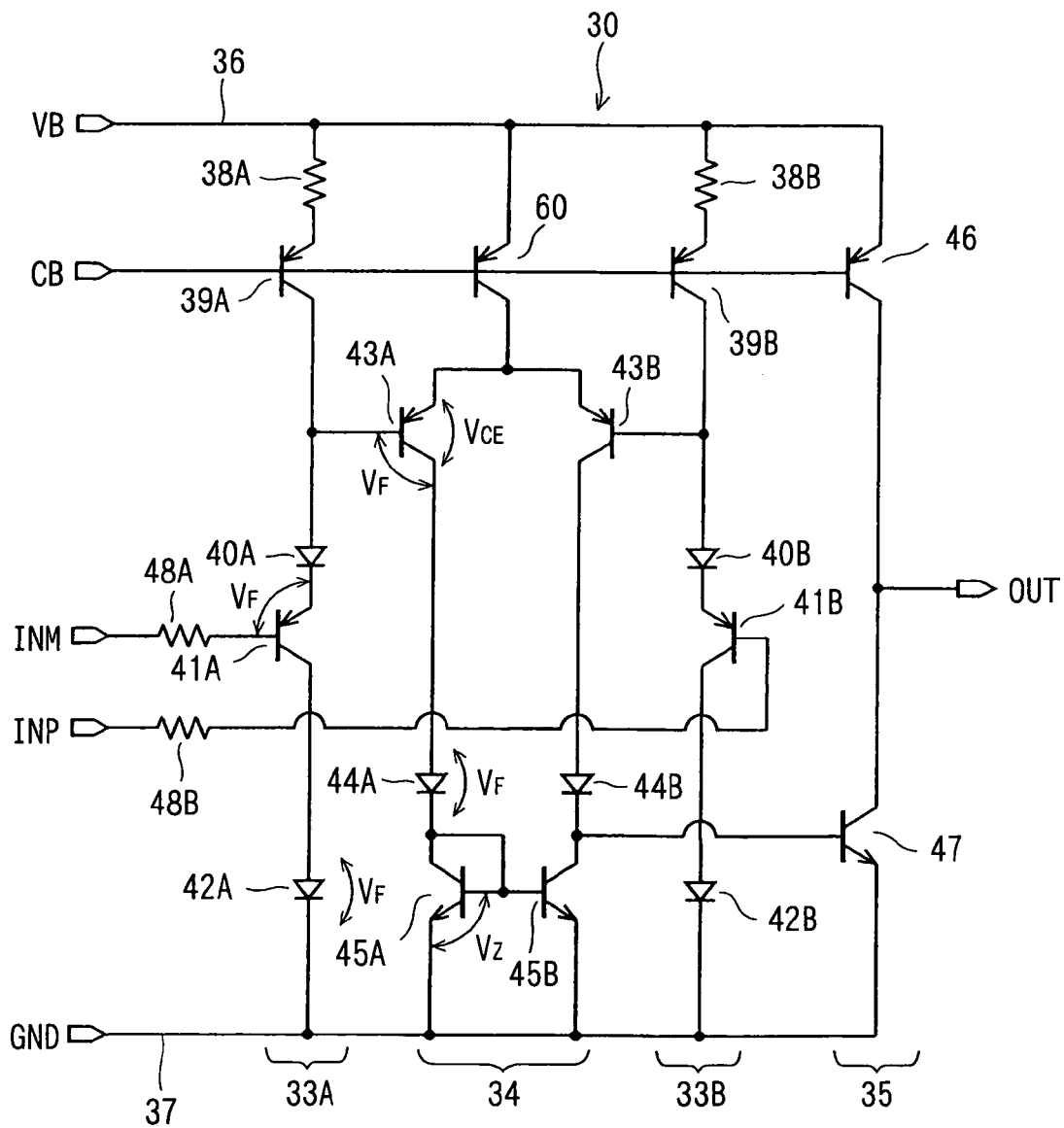
FIG. 3 is a circuit diagram showing in detail the differential amplifier circuit in the first embodiment.

As shown in FIG. 3, the comparator 30 includes signal input circuits 33A and 33B, a differential amplifier circuit 34 and a signal output circuit 35. A power source line 36 is connected to the power source VB, and a ground line (circuit ground) 37 is connected to the ground (body earth) as a reference potential 0 V.

It is to be noted that in FIG. 3 circuit elements which are symmetrical to each other are denoted with characters A and B attached to the same reference numerals. However, in the following description, the characters A and B are used only when the two symmetrical circuit elements are to be particularly distinguished.

The signal input circuit 33 includes a series circuit of a resistor 38, a PNP transistor 39, a diode 40 as a rectifier, a PNP transistor 41 as an input transistor, and a diode 42 as a rectifier, which is connected between the power source line 36 and the ground line 37. The resistor 38 is for limiting a current, and bases of the transistors 39A and 39B, which form current sources, are connected in common to a base CB of a transistor (not shown) forming a mirror pair. Bases of the input transistors 41A and 41B are connected to input terminals INM and INP through resistors 48, respectively.

A differential amplifier circuit 34 includes PNP transistors 43A and 43B forming a differential pair, a PNP transistor 60 as a current source connected between emitters (power source side output terminals) of these and the power source line 36, diodes 44 connected to collector (ground side output terminal) sides of the transistors 43, and NPN transistors 45 forming active loads. A base of the transistor 60 is connected to the base CB, and bases of the differential pair transistors 43 are connected to anodes of the diodes 40. Bases of the transistors 45A and 45B forming a mirror pair are connected in common to a collector on the side of the transistor 45A.

The signal output circuit 35 includes a series circuit of a PNP transistor 46 and an NPN transistor 47, which is connected between the power source line 36 and the ground line 37 and is a current source. A base of the transistor 46 is connected to the base CB, and a base of the transistor 47 is connected to a collector of the transistor 45B. A common connection point of the transistors 46 and 47 is an output terminal OUT of the comparator 30.

The above structure of the comparator 30 is not different from that of a common comparator except for the diodes 40, 42 and 44. Each diode 40, 42 and 44 is provided by a PN junction of a transistor as shown in FIG. 4.

Next, the operation of the first embodiment will be described. Each of the diodes 40, 42 and 44 disposed in the comparator 30 functions as follows.

<Diode 42>

It is assumed that the connection between the ground line 37 of the comparator 30 and the ground as the reference potential 0 V is cut off accidentally for some cause, and the ground line 37 is brought into an open state. At this time, the potential of the ground line 37 becomes indefinite, and changes according to the state of wiring impedance and the like.

In such circumstances, in the case where the diode 42 does not exist as in a conventional structure, when the signal levels applied to the input terminals INP and INM become lower than the potential at the side of the ground line 37, it is supposed that current flows in reverse from the circuit ground side 37 through the transistor 41 to the side of the input terminals INP and INM. Accordingly, the diode 42 is disposed to prevent such reverse flow of current from occurring.

<Diode 44>

Similarly to the above, it is assumed that the signal levels applied to the input terminals INP and INM are lowered in the case where the ground line 37 is brought into the open state. Here, it is also assumed that a reverse breakdown voltage between the emitter and base of the transistor 45 is VZ, and a forward voltage of the PN junction is VF.

In the case where the diodes 44 and 40 do not exist as in the conventional structure, when the input signal level is lowered to (−VZ−2 VF) or less with reference to the potential of the ground line 37, breakdown occurs between the emitter and base of the transistor 45. Here, −2 VF corresponds to the voltage between the collector and base of the transistor 43 and the voltage between the emitter and base of the transistor 41.

When the transistor 45 breaks down, current flows in reverse to the input terminal side through the collector and base of the differential pair transistor 43 and the input transistor 41. Accordingly, the diode 44 is disposed to prevent the reverse flow of current from occurring through the differential pair transistor 43.

<Diode 40>

As a result of the diodes 42 and 44 disposed to prevent the reverse flow of current, the level-shift function occurs in the inside of the comparator 30 by the forward direction voltages VF of those. That is, at the collector side of the differential pair transistor 43, there occurs the shift of 2 VF of the sum of the voltage VF by the transistor 45 of the mirror circuit forming the current source at the ground side and the forward voltage VF of the diode 44. Besides, at the emitter side of the transistor 43, there occurs the shift of 2 VF of the sum of the forward voltage VF of the diode 42 and the voltage VF by the input transistor 41.

As a result, the emitter and the collector of the differential pair transistor 43 have substantially the same potential, and unless the input signal level becomes a level exceeding the voltage VCE between the collector and emitter of the transistor 43, the differential pair transistor 43 does not operate.

When the diode 40 is disposed in the signal input circuit 33, the input signal is level-shifted by the forward voltage VF, and the emitter potential of the differential pair transistor 43 can be raised by VF. As a result, similarly to the conventional comparator, also with respect to an input signal close to the ground level, it becomes possible to cause the differential amplification function to be performed.

As a result of the comparator 30 constructed as above, the minimum operation voltage of the power source VB is lowered by the forward voltage VF of the diode. However, with respect to the structure like the receiver circuit 25, no adversary influence will arise in the operation.

According to the first embodiment, in the inside of the comparator 30, the diodes 44A and 44B are respectively disposed in the forward direction between the two transistors 43A and 43B forming the differential pair and the ground line 37, specifically, between those and the mirror pair transistors 45A and 45B forming the active loads. Thus, even in the case where the ground line 37 is brought into the open state, and consequently, the potential of the GND line 37 rises, it is possible to prevent the current from flowing in reverse to the input terminal side through the differential pair transistor 43.

Besides, since the diode 42 is disposed in the forward direction between the signal input transistor 41 and the ground line 37, even in the case where the ground potential rises as a result that the ground line 37 is brought into the open state, the diode 42 can prevent the current from flowing in reverse to the input side through the signal input transistor 41.

Further, since the diode 40 is disposed in the forward direction also between the differential pair transistor 43 and the signal input transistor 41, the input signal is level-shifted by the forward direction voltage VF, and the emitter potential of the differential pair transistor 43 can be raised by VF. Accordingly, similarly to the conventional comparator, also with respect to the input signal close to the ground level, it becomes possible to cause the differential amplification function to be performed.

In addition, in the receiver circuit 25 used for the communication using the in-vehicle LAN, the application to the comparator 30 for comparing the received signal level with the reference voltage level is made. Therefore, even in the case where the circuit ground of the comparator 30 is brought into the open state, the reverse flow of current to the side of the LIN bus 16 is prevented. Thus it is possible to prevent the communication from being brought into an impossible state.

Second Embodiment

Figure 5:
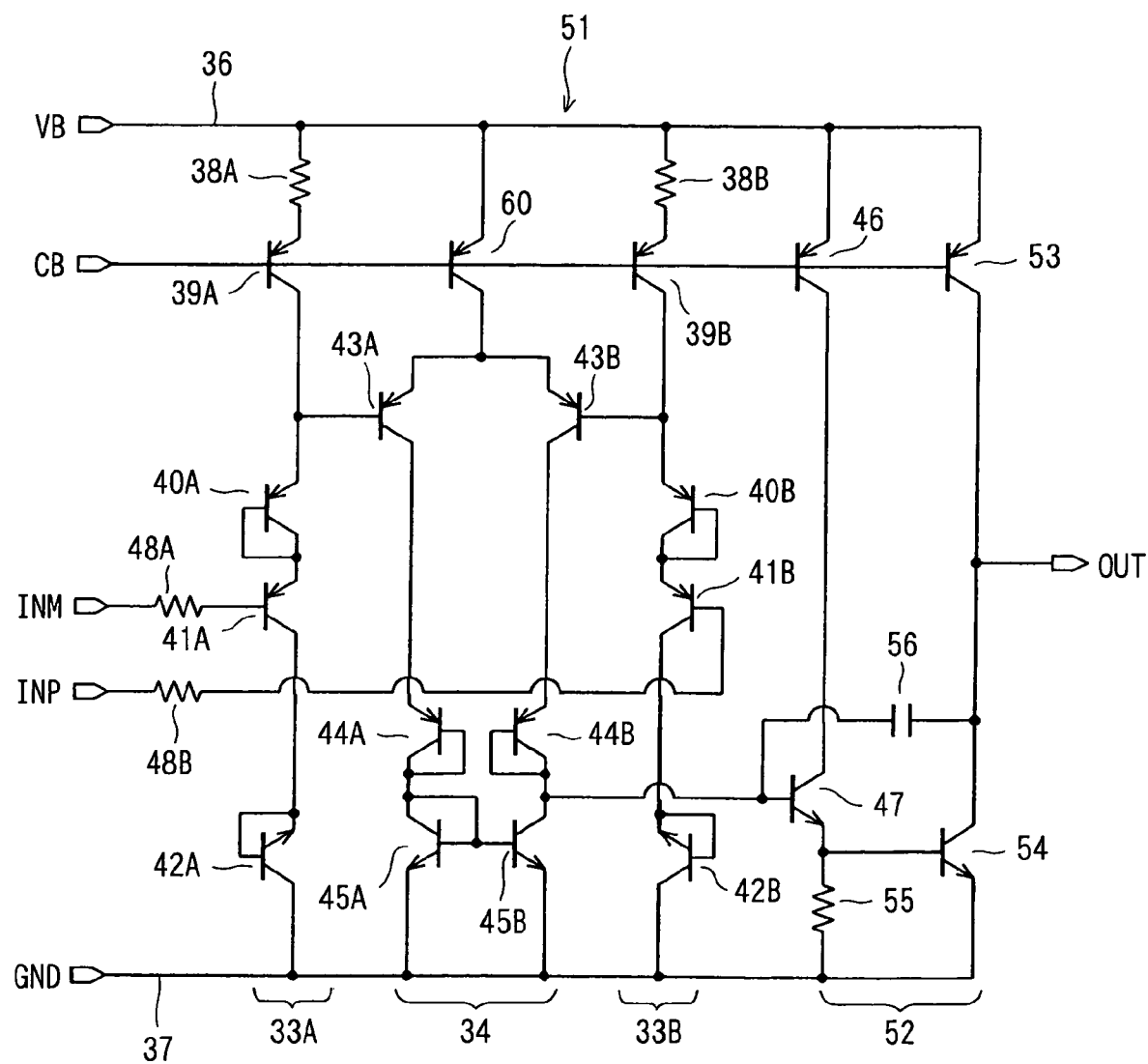
FIG. 5 is a circuit diagram showing in detail the differential amplifier circuit used in an operational amplifier according to a second embodiment of the present invention.

A second embodiment is shown in FIG. 5, in which the same portions as those of the first embodiment are denoted by the same numerals and characters. The second embodiment shows a case where a differential amplifier circuit is used in an operational amplifier 51. The comparator and the operational amplifier are similar to each other in the basic circuit operation, and only a structure of an output stage 52 is different.

As shown in FIG. 5, in the operational amplifier 51, and in the signal output circuit 52 replacing the signal output circuit 35, a series circuit of a PNP transistor 53 and an NPN transistor 54 is disposed a between the power source line 36 and the ground line 37. A common connection point of those is an output terminal OUT of the operational amplifier 51.

A base of the transistor 53 is connected to the base CB, and a base of the transistor 54 is connected to an emitter of the transistor 47. A resistor 55 is inserted between the emitter of the transistor 47 and the ground line 37. A base of the transistor 47 is connected to the output terminal OUT through a capacitor 56 for phase compensation.

This operational amplifier 51 is used in, for example, a circuit portion for performing feedback control in the inside of the driver circuit 23 at the transmission side in the transceiver IC 11.

Also with respect to the operational amplifier 51, the function and effects similar to those of the comparator 30 in the first embodiment can be obtained.

In the above embodiments, the diode 44 may be disposed between the emitter of the transistor 45 and the ground line 37. Besides, in this case, a level-shift adjustment may be performed at the side of the signal output circuit 35. For example, in the case where it is not necessary to handle an input signal close to the ground level, the transistor 40 need not be used.

Besides, the signal input transistor 41 may be provided as the need arises, and it is sufficient if the diode 42 is disposed in the case where the signal input transistor 41 is needed.

The comparator 30 is not limited to one forming the receiver circuit for the in-vehicle LAN, buy may be applied to any circuit. Besides, the invention can be applied to, in addition to a component forming the comparator or the operational amplifier, any differential amplifier circuit.

The invention is not limited to only the embodiments described above and shown in the drawings, and various modifications or changes can be made.

What is claimed is:

1. A differential amplifier circuit comprising:
    differential pair transistors formed to operate differentially;
    a circuit ground connected to the differential pair transistors;
    first rectifiers disposed between the transistors and the circuit ground in a forward direction to prevent reverse flow of current from the circuit ground to the differential pair transistors, respectively;
    signal input transistors disposed at input sides of the differential pair transistors to receive input signals for the differential pair transistors; and
    second rectifiers disposed between the circuit ground and the signal input transistors in a forward direction to prevent reverse flow of current from the circuit ground to the signal input transistors, respectively.

2. The differential amplifier circuit according to claim 1, further comprising:
    third rectifiers disposed between the signal input transistors and the differential pair transistors in a forward direction to prevent reverse flow of current from the signal input transistors to the differential pair transistors, respectively.

3. A differential amplifier circuit comprising:
    differential pair transistors formed to operate differentially;
    a circuit ground connected to the differential pair transistors;
    first rectifiers disposed between the transistors and the circuit ground in a forward direction to prevent reverse flow of current from the circuit ground to the differential pair transistors, respectively; and
    current mirror transistors connected to the differential pair transistors, wherein the first rectifiers are disposed between the differential pair transistors and the current mirror transistors, respectively.

4. A differential amplifier circuit comprising:
    differential pair transistors formed to operate differentially;
    a circuit ground connected to the differential pair transistors;
    first rectifiers disposed between the transistors and the circuit ground in a forward direction to prevent reverse flow of current from the circuit ground to the differential pair transistors, respectively; and
    current mirror transistors connected to the differential pair transistors, wherein the first rectifiers are disposed between the circuit ground and the current mirror transistors, respectively.

5. A differential amplifier circuit comprising:
    differential pair transistors formed to operate differentially;
    a circuit ground connected to the differential pair transistors; and
    first rectifiers disposed between the transistors and the circuit ground in a forward direction to prevent reverse flow of current from the circuit ground to the differential pair transistors, respectively,
    wherein the differential pair transistors are constructed to compare, with a reference voltage level, an input signal level applied from a receiver circuit used for communication using an in-vehicle LAN.

* * * * *